(12) United States Patent
La Placa et al.

(10) Patent No.: US 7,304,505 B2
(45) Date of Patent: Dec. 4, 2007

(54) OUTPUT BUFFER STAGE

(75) Inventors: Michele La Placa, Cefalù (IT); Ignazio Martines, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 81 days.

(21) Appl. No.: 11/272,847

(22) Filed: Nov. 14, 2005

(65) Prior Publication Data

US 2006/0103425 A1    May 18, 2006

(30) Foreign Application Priority Data

Nov. 12, 2004    (IT) .......................... VA2004A0048

(51) Int. Cl.
*H03K 19/094*    (2006.01)
(52) U.S. Cl. .......................... 326/87; 326/30; 327/112; 327/391
(58) Field of Classification Search ................ 326/30, 326/83, 86, 87; 327/108, 111, 112, 170, 327/391
See application file for complete search history.

(56) References Cited

U.S. PATENT DOCUMENTS 6,958,626 B2 *    10/2005    Terletzki et al. .............. 326/83

* cited by examiner

*Primary Examiner*—Daniel D. Chang
(74) *Attorney, Agent, or Firm*—Lisa K. Jorgenson; Allen, Dyer, Doppelt, Milbrath & Gilchrist, P.A.

(57) ABSTRACT

The output buffer stage includes a half-bridge output stage having a first pair of complementary drivers connected in series between a supply line and a ground node, the high impedance state or conduction state of which is determined through a pair of control phases. The buffer stage includes a pair of switches controlled by the control phases, connected in series between them and connecting the transistors of the first stage in series. Each driver is connected in series with a switch, that is quickly opened to prevent under-threshold currents from circulating when the respective driver is turned off, and that is rapidly turned off when the respective driver is turned on.

15 Claims, 4 Drawing Sheets

OUTPUT BUFFER STAGE

FIELD OF THE INVENTION

This invention relates in general to output stages, and more particularly to an output stage with slew-rate control, especially for a nonvolatile memory.

BACKGROUND OF THE INVENTION

The market requires ever faster memory devices. A limit to the maximum speed at which a memory may output data read from it is determined by the relative slowness with which output buffers of these devices produce the relative logic voltage on an output node. For this reason, the switching frequency of these output stages must be the largest possible for reducing switching times.

In general, reducing the switching times of the output buffers implies large time derivative values of the current absorbed by or discharged from the load capacitance. Because of parasitic inductances that characterize the connections of the supply pads of the device and external circuits, large time derivative values of the current may degrade performances or even cause errors.

FIGS. 1a and 1b show two output buffer stages with enable circuits of the PMOS transistor MP1 of the output buffer. Enabling circuits equivalent to those represented in the figures are used for enabling the NMOS transistor MN1. To prevent abrupt current variations it is necessary to accurately control the gates of the drivers MP1 and MN1. In practice, the gate of either the transistor MP1 or MN1 to be turned on is driven with a limited voltage gradient, via a current generator, as shown in FIG. 1a, or by a RC network, as shown in FIG. 1b, such to gradually charge/discharge the gate capacitances.

In both cases, because of the low slope of the driving voltage on the gates of the transistors, a turn-on delay Td of the transistor is determined, as schematically shown in FIG. 2 for the circuit of FIG. 1a (line 1) and for the circuit of FIG. 1b (line 2). For the illustrated case of the PMOS transistor MP1, this delay is given by the time interval necessary for reaching the threshold voltage Vtp. In the case of FIG. 1a, being I the constant discharge current of the gate capacitance of the PMOS transistor MP1, the following equation holds:

$$Td = C_{OX} \cdot Vtp/I$$

being $C_{OX}$ the gate capacitance of the gate of the PMOS transistor MP1. The resulting waveform of the output voltage $V_{OUT}$ on the capacitor $C_{Load}$ is as shown in FIG. 3. When a relatively high speed of the buffer is required, the turn-on delay Td may become of the same order of magnitude of the switching time, and this is unacceptable.

The known circuit of FIG. 4 circumvents this problem by driving the gates of the driver of the output buffer stage with a voltage having a stepwise-linear waveform with different slopes: an initial steep slope for rapidly reaching the threshold of the transistors followed by an interval with a relevantly less steep slope for reducing the disturbances (noise) introduced on the supply lines.

The charge/discharge of the gate node of the transistor MP1, in this first interval, is obtained by applying a current pulse of a finite duration δT as schematically illustrated in FIG. 4. In this case, $$Ipre \cdot \delta T = C_{OX} \cdot Vth$$

with Vth and $C_{OX}$ being parameters that depend on the fabrication process and the working temperature, it is difficult to approximate satisfactorily the above equation in all working conditions: the time interval δT could be too short, thus penalizing performances, or it could be too long, thus turning on the drivers with too steep slopes.

U.S. Pat. No. 6,141,263, of Micron Technology Inc., discloses an output driver that comprises a plurality of circuits for driving a pull-up signal of a data driver, and a control circuit that selects a completely pre-charged circuit among these circuits when the datum generated by the output driver is logically high.

Another approach is disclosed in the U.S. published patent application No. 2003/0059997, of STMicroelectronics S.r.l., wherein the circuit for driving the driver MP1 is depicted in FIG. 5. The buffer stage has a circuit for pre-setting the voltage on the gates of the drivers, to bias them at the turn-on limit voltage, in practice making the gate-source voltage of the drivers MP1 and MN1 equal to the threshold voltage Vth.

The gate of the driver MP1 is pre-charged by setting high the control phase EN. When the voltage Vin is the ground voltage GND, the gate of the transistor MP1 is set to a voltage $V_{CC}-Vd$, being $V_{CC}$ the supply voltage and Vd the voltage drop on the nodes of the pre-setting diode MP3 biased by the current forced by the MOS MN2.

When Vin switches to $V_{CC}$, the driver MN1 is rapidly set to the turn-on edge with a circuit dual of that of FIG. 5, and the gate of the transistor MP1 is gradually brought from $V_{CC}-Vd$ to ground. Therefore, the transistor is completely turned on and the output capacitor $C_{Load}$ is charged at the voltage $V_{CC}$, that represents the datum to be output.

This approach is less critical than that of FIG. 4 from the point of view of the pre-charge at the threshold voltage. Indeed, the pre-setting diode MP3 in FIG. 5 keeps the gate voltage of the transistor MP1 always at a voltage close to the threshold voltage without the need of imposing a safety interval, which by contrast is required by the circuit of FIG. 4.

Despite the fact that the buffer of FIG. 5 is not burdened by the common drawbacks, memory devices that use these circuits often have power consumption in a stand-by state that exceeds pre-established specifications that, according to design calculations, should have been satisfied.

From thorough analysis of the operation of this circuit, it has been noticed that when the transistors MP1 and MP2 are driven in a high impedance state, they are in a under-threshold conduction state, and this could explain the excessive power consumption in a stand-by state of the memory devices.

Indeed, because of the relatively large dimensions of the drivers, the current that flows through them in this state may be relevant. Moreover, this current is not completely under control when the working conditions, supply and temperature vary, thus it may even cause failures.

SUMMARY OF THE INVENTION

This invention provides a simple and effective approach to address the above noted problem. In practice, in a buffer of this invention each driver is connected in series with a switch, that is quickly opened to prevent under-threshold currents from circulating when the respective driver is turned off, and that is rapidly turned off when the respective driver is turned on so as to not interfere with the operation of the latter.

More specifically, this invention provides a buffer stage comprising a half-bridge output stage having a first pair of complementary drivers connected in series between a supply line and a ground node, the high impedance state or conduction state of which is determined through a pair of control phases. The buffer stage of this invention addresses the above mentioned problem because it comprises a pair of switches controlled by the control phases, connected in series between them and connecting in series the transistors of the first stage.

According to a preferred embodiment, the buffer stage of this invention comprises a discharge path of the intrinsic capacitance of each driver, enabled/disabled when the respective driver must be turned on/off.

BRIEF DESCRIPTION OF THE DRAWINGS

The invention will be described referring to the attached drawings, wherein:

FIG. 3 is a timing diagram that compares the waveform of the gate voltage on the driver MP1 in a turn-off phase for the circuit of FIG. 1a;

DETAILED DESCRIPTION OF THE PREFERRED EMBODIMENTS

Figure 6:
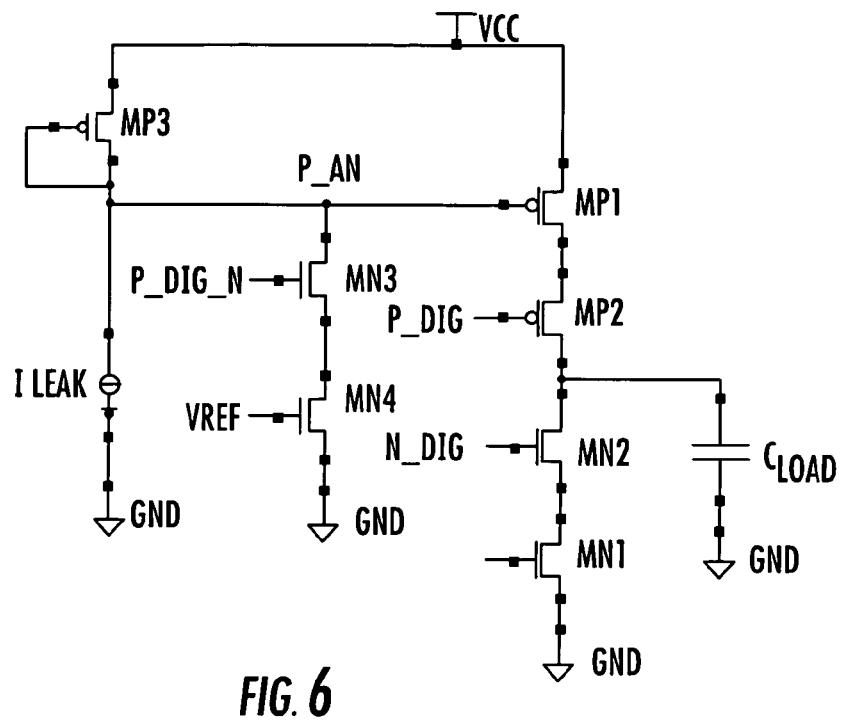
FIG. 6 is a schematic diagram showing a first embodiment of the buffer stage of the present invention.

FIG. 6 shows a preferred embodiment of the output buffer of this invention. For simplicity sake, only the portion of the circuit that pre-charges and turns on the driver MP1 is depicted. Of course, for the driver MN1, there is a control circuit dual of the circuit that will be described for the driver MP1.

The driver MP1 is connected to the output node through a switch of the same polarity MP2 controlled by a properly generated digital signal P_DIG. This switch MP2 is turned on/off when it is necessary to turn on/off the driver MP1. In so doing, considering what happens in the known buffer of FIG. 5, under-threshold currents are prevented from flowing through the driver MP1.

When the driver MP1 must be turned off, the control phase P_DIG of the gate of MP2 switches to a logically high value for turning off the switch MP2, biasing the gate of the driver MP1 at the supply voltage minus the voltage drop on the diode connected transistor MP3. The current generator Ileak forces through the transistor MP3 a certain current Ileak of a pre-determined value such that the voltage drop on it be close to the threshold voltage of the driver MP1. Thus, the driver MP1 is turned off but its gate is pre-charged with a voltage close to the threshold voltage and it may be turned on rapidly. Moreover, any under-threshold current flows through the driver MP1 because the switch MP2 in series with it is turned off. Optionally, the transistor MP3 may be substituted with a resistor of a certain value for having on it the desired voltage drop.

When the driver MP1 must be turned on, the control phase P_DIG switches to a low voltage value and turns on the switches MP2 and MN3, the latter being controlled by the inverted replica P_DIG_N of the control phase P_DIG. The driver MP1 is turned on because the discharge path, composed of the transistors MN3 and MN4, grounds the gate voltage. The gate capacitance of MP1 is discharged at a certain discharge current, determined by the transistor MN4. This transistor is biased with a certain voltage Vref such to function as a constant current generator. Therefore, the driver MP1 is gradually turned on, thus reducing the current peaks on the supply line.

For sake of simplicity, the above description of the circuit of this invention for turning on/off the driver MP1 is not replicated for the driver MN1. Any skilled person will immediately recognize the manner in which a circuit dual of that represented in FIG. 6 must be realized for similarly turning on/off the driver MN1 complementary of the driver MP1.

Figure 7:
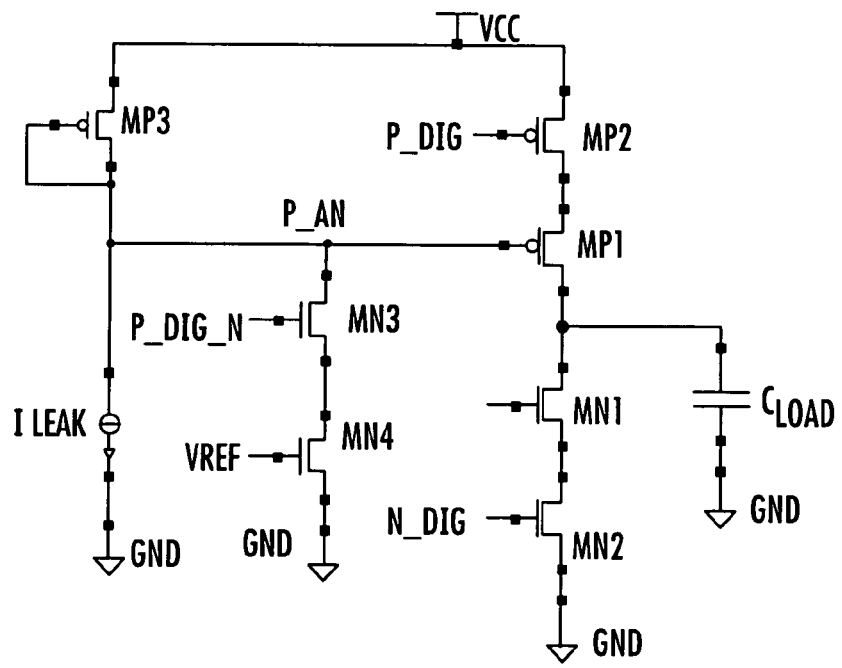
FIG. 7 is a schematic diagram showing a second alternative embodiment of the buffer stage of the invention.

Another embodiment of the buffer of this invention is shown in FIG. 7, the switches of which are connected to the supply lines and grounds, instead of being connected to the output node. The functioning is similar to that of the buffer of FIG. 6. The advantage of the buffer of FIG. 7 in respect to the architecture of FIG. 6 is that the switches MP2 and MN2, when they are turned on, constitute source degeneration resistances for the drivers MP1 and MN1. Normally, output buffer stages do not have source degeneration resistances, even if they are desirable, because, in general, this implies over-dimensioning the drivers.

In the buffer of FIG. 7, it is thus possible to determine the value of the on-resistance of the switches, that is of a source resistance of the drivers, for stabilizing the functioning (switching speed and noise induced on the supply lines) of the buffer when the supply voltage varies.

Figure 1A:
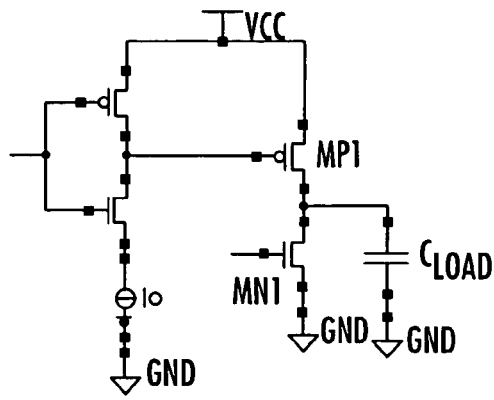
FIGS. 1a and 1b are schematic diagrams that depict two known buffer stages.
Figure 1B:
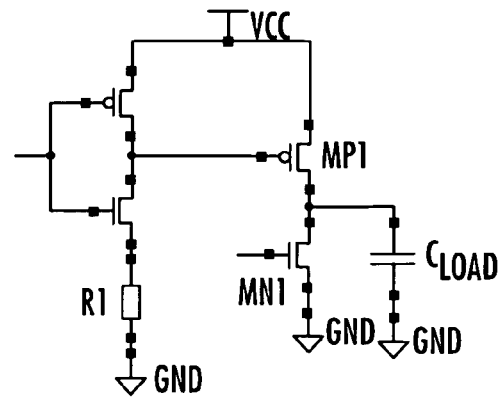
Figure 2:
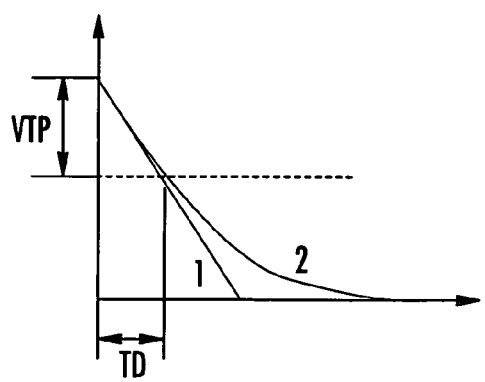
FIG. 2 is a timing diagram that compares the gate voltage on the driver MP1 during a turn on phase for the circuit of FIG. 1a (line 1) and of FIG. 1b (line 2)
Figure 3:
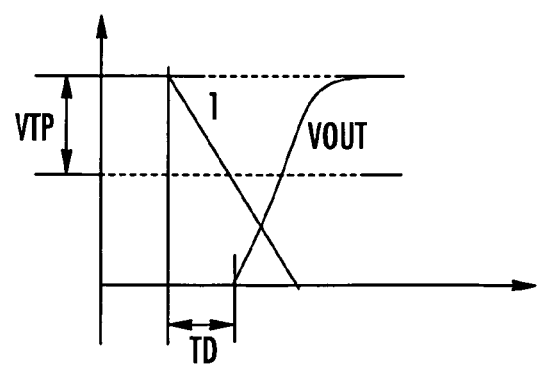
Figure 4:
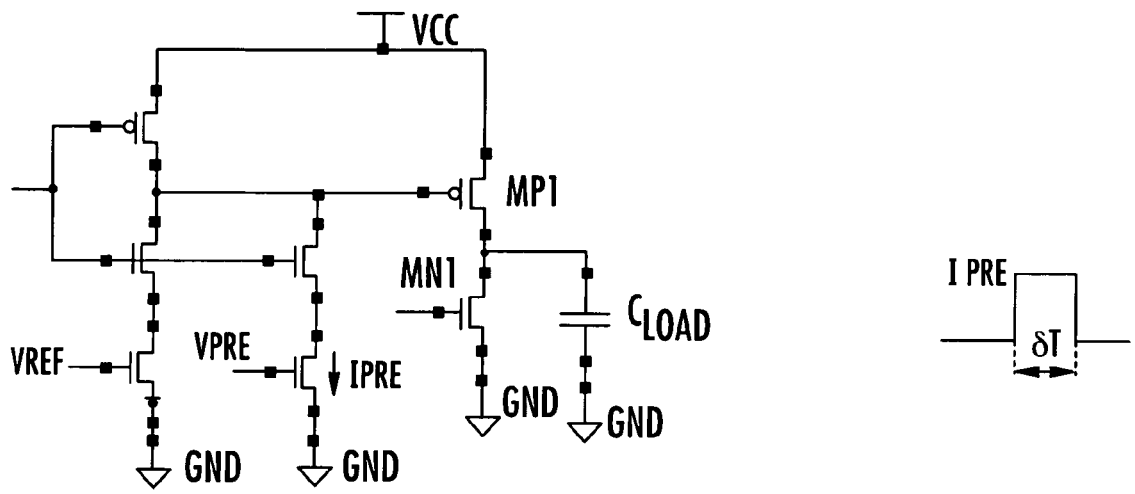
FIG. 4 is a schematic diagram showing a known buffer stage with a discharge path of the gate capacitance of the driver MP1.
Figure 5:
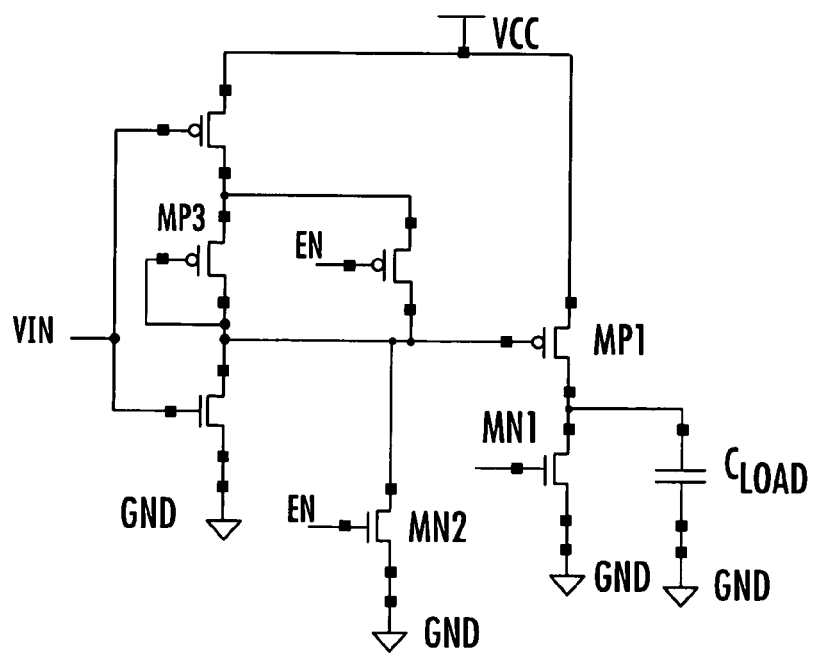
FIG. 5 is a schematic diagram showing a buffer stage of the U.S. published prior patent application No. 2003/0059997.
Figure 8:
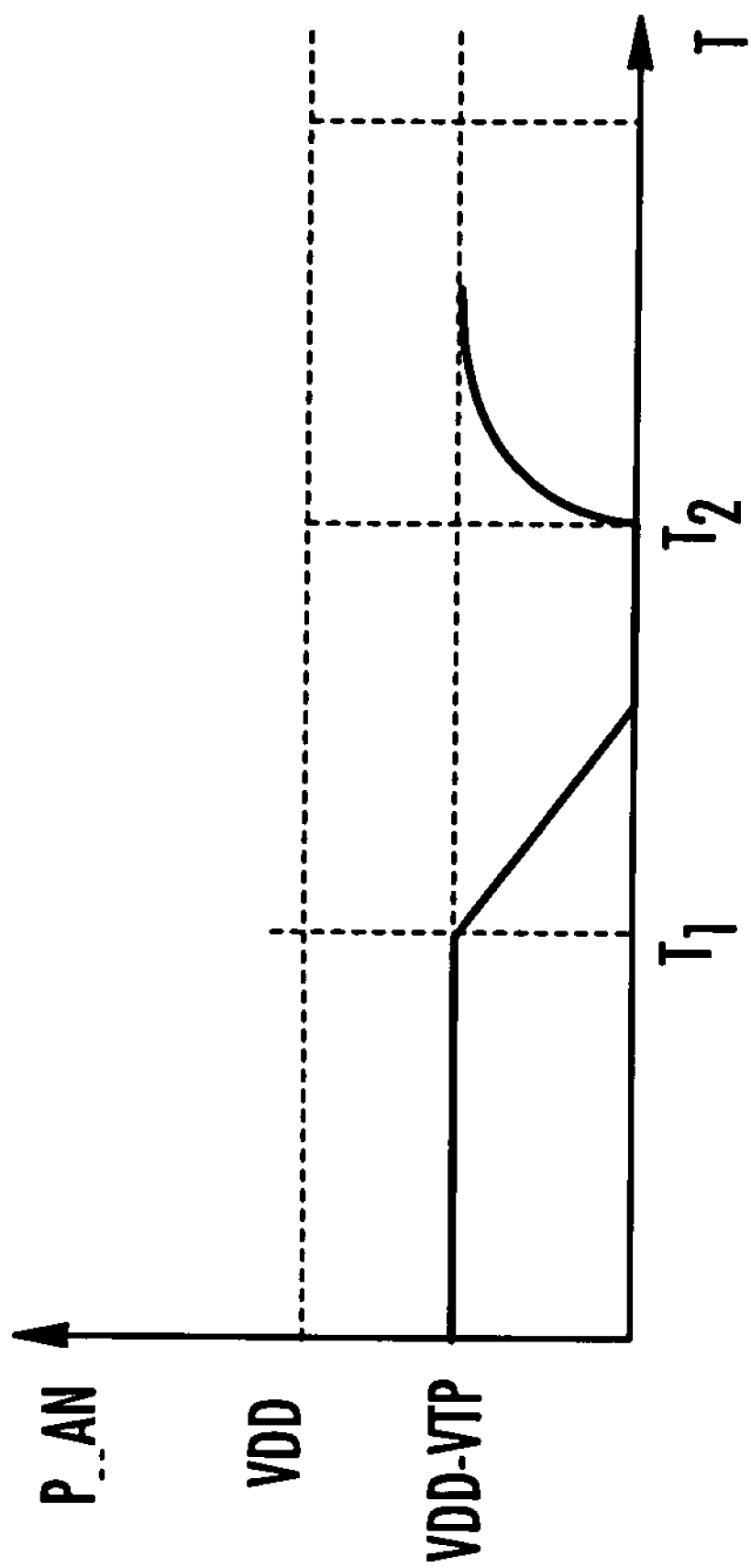
FIG. 8 is a timing diagram of the gate voltage of the driver MP1 during a turn-on and a turn-off phase in accordance with the present invention.

The timing diagram of FIG. 8 of the gate voltage of the driver MP1 shows clearly that the driver MP1 starts turning on or off without any delay in the turn on instant ($t_1$) and turn off instant ($t_2$) as in the known buffer stage of FIG. 5, but without being affected by the drawback of a current flowing through the drivers, when they are biased in a high impedance state.

In general, a current generator Ileak may be used for having a voltage drop on the transistor MP3 equal to the threshold voltage of the driver MP1, with a consequent power consumption. The additional power consumption due to the current generator Ileak when the driver MP1 is turned off can be made negligible by properly dimensioning the transistor MP3.

Preferably, the switches MP2 and MN2 will be identical to the respective drivers MP1 and MN1 and their dimensions are chosen such to minimize the generation of noise. The buffer stage of this invention may be advantageously used in memory devices for producing, on an output line, data read from the cell array.

That which is claimed is:

1. A buffer stage comprising:
 a half-bridge output stage having a pair of complementary drivers connected in series between a supply line and a common reference voltage node, and having a conduction state determined through a pair of control signals;
 a pair of switches controlled by the control signals, and connected in series with the pair of complementary drivers; and a third switch providing a discharge path of an intrinsic capacitance of the at least one driver, the third switch being enabled and disabled when the at least one driver is turned on and off, respectively.

2. The buffer stage of claim 1, wherein a common current mode of the pair of switches defines an output node of the buffer stage.

3. The buffer stage of claim 1, further comprising a bias circuit to bias the control terminal of at least one of the drivers at a voltage close to the threshold voltage of the at least one driver.

4. The buffer stage of claim 1, wherein the bias circuit comprises:
a diode connected between the control terminal and one of the supply and voltage reference node to which the at least one driver is connected; and
a current generator that biases the diode with a current such that a voltage drop substantially equal to a threshold voltage of the at least one driver is produced on the diode.

5. The buffer stage of claim 1, wherein said bias circuit comprises:
a resistor connected between the control terminal and one of the supply and reference voltage node to which the at least one driver is connected; and
a current generator that biases the resistor with a current such that a voltage drop substantially equal to a threshold voltage of the at least one driver is produced on the resistor.

6. The buffer stage of claim 1, wherein the discharge path comprises a generator to generate a discharge current and controlled by the third switch.

7. The buffer stage of claim 1, wherein the third switch comprises a third transistor complementary to the first driver of the pair of complementary drivers, and controlled by a third control signal that is an inverted replica of the control signal that controls the first driver.

8. The buffer stage of claim 1, wherein said pair of switches comprises a second pair of complementary transistors substantially identical to the pair of complementary drivers.

9. A buffer stage to be connected between a supply line and a common reference voltage node, and comprising:
a half-bridge output stage having first and second complementary drivers connected in series, and having a conduction state controlled by a pair of control signals;
first and second switches controlled by the control signals, and connected in series with the first and second complementary drivers;
a bias circuit to bias a control terminal of the first driver at a voltage close to the threshold voltage of the first driver; and
a third switch providing a discharge path of an intrinsic capacitance of the first driver, the third switch being enabled and disabled when the first driver is turned on and off, respectively.

10. The buffer stage of claim 9, wherein the bias circuit comprises:
a diode connected between the control terminal and one of the supply and voltage reference node to which the first driver is connected; and
a current generator that biases the diode with a current such that a voltage drop substantially equal to a threshold voltage of the first driver is produced on the diode.

11. The buffer stage of claim 9, wherein the bias circuit comprises:
a resistor connected between the control terminal and one of the supply and reference voltage node to which the first driver is connected; and
a current generator that biases the resistor with a current such that a voltage drop substantially equal to a threshold voltage of the first driver is produced on the resistor.

12. A method of operating a buffer stage including a half-bridge output stage having a pair of complementary drivers connected in series between a supply line and a common reference voltage node, the method comprising:
controlling a conduction state of the half-bridge output stage having with a pair of control signals;
connecting a pair of switches, controlled by the control signals, in series with the pair of complementary drivers; and
providing a discharge path of an intrinsic capacitance of the at least one driver with a third switch being enabled and disabled when the at least one driver is turned on and off, respectively.

13. The method of claim 12, further comprising biasing the control terminal of at least one of the drivers at a voltage close to the threshold voltage of the at least one driver.

14. The method of claim 13, wherein biasing comprises:
providing a bias circuit including
a diode connected between the control node and one of the supply and voltage reference node to which the at least one driver is connected, and
a current generator that biases the diode with a current such that a voltage drop substantially equal to a threshold voltage of the at least one driver is produced on the diode.

15. The method of claim 13, wherein biasing comprises:
providing a bias circuit including
a resistor connected between the control terminal and one of the supply and reference voltage node to which the at least one driver is connected, and
a current generator that biases the resistor with a current such that a voltage drop substantially equal to a threshold voltage of the at least one driver is produced on the resistor.

* * * * *

UNITED STATES PATENT AND TRADEMARK OFFICE
CERTIFICATE OF CORRECTION

| | |
|---|---|
| PATENT NO. | : 7,304,505 B2 |
| APPLICATION NO. | : 11/272847 |
| DATED | : December 4, 2007 |
| INVENTOR(S) | : La Placa et al. |

It is certified that error appears in the above-identified patent and that said Letters Patent is hereby corrected as shown below:

Column 6, Line 24        Delete: "having"

Signed and Sealed this

Second Day of September, 2008

JON W. DUDAS
*Director of the United States Patent and Trademark Office*